United States Patent [19]
Hässler et al.

[11] Patent Number: 6,153,496
[45] Date of Patent: Nov. 28, 2000

[54] PROCESS FOR THE PRODUCTION OF POLYCRYSTALLINE SILICON MOULDINGS SUBSTANTIALLY FREE OF EDGE REGIONS AND THE USE OF THESE MOULDINGS

[75] Inventors: Christian Hässler, Krefeld; Johannes Liebermann, Pulheim, both of Germany

[73] Assignee: Bayer AG, Leverkusen, Germany

[21] Appl. No.: 09/041,324

[22] Filed: Mar. 12, 1998

[30] Foreign Application Priority Data

Mar. 20, 1997 [DE] Germany .......................... 197 11 550

[51] Int. Cl.$^7$ .................................................. C30B 15/12
[52] U.S. Cl. .......................... 438/488; 438/478; 438/365; 438/482; 438/532
[58] Field of Search .................................. 438/488, 478, 438/764, 57, 48

[56] References Cited

U.S. PATENT DOCUMENTS

| | | | |
|---|---|---|---|
| 4,144,099 | 3/1979 | Edmonds et al. | 148/1.5 |
| 4,243,471 | 1/1981 | Ciszek et al. | 156/616 |
| 4,376,657 | 3/1983 | Nagasawa et al. | 148/1.5 |
| 4,636,280 | 1/1987 | Nakai et al. | 156/603 |
| 5,336,335 | 8/1994 | Hall et al. | 136/258 |
| 5,431,869 | 7/1995 | Kumar et al. | 264/85 |

FOREIGN PATENT DOCUMENTS

| | | |
|---|---|---|
| 1 283 814 | 11/1968 | Germany . |
| 147 118 | 3/1981 | Germany . |

OTHER PUBLICATIONS

D. Helmreich, "Progress in Ingot and Foil Casting of Silicon", Journ. of Crystal Growth vol. 79 1986 pp. 562–571.

T. F. Ciszek, "Directionally Solidfied solar–grade Silicon using Carbon Crucibles", Journ. of Crystal Growth vol. 46, 1979 pp. 527–533.

Jastrzebski, L.; Zanzucchi, P., Thebault, D. and Lagowski. J., "Method to Measure the Precipitated and Total Oxygen Concentration in Silicon", *J. Electrochem. Soc.*, 129(7):1638–1641 (Jul. 1982).

Glinchuk, K.D.; Litovchenko, N.M. and Merker, R., "Effect of Quenching Rate and Annealing on the Concentration of Quenched–in Recombination Centers in Heat Treated Silicon", *Chemical Abstracts*, 85 (No. 85956):552 (1976).

JP 59–119842 A, dated Jul. 11, 1984, Japan (Abstract Only).

German search report for foreign counterpart application No. 197 11 550.0 (Feb. 7, 1998).

M. Acciarri, S. Binetti, S. Ratti, C. Savigni and S. Pizzini, *Study and Conditioning of Defected Areas in Eurosil Multicrystalline Silicon*, Proceedings of the 13$^{th}$ European Photovoltaic Solar Energy Conference, pp. 1336–1339 (Oct. 23–27, 1995).

G. Goaer, E. Borne, QN. Le and D. Sarti, *Elaboration and Characterization of the 155 KG Polix Multicrystalline Silicon Ingots*, Proceedings of the 13$^{th}$ European Photovoltaic Solar Energy Conference, pp. 1415–1417 (Oct. 23–27, 1995).

E. Borne, G. Goger, D. Sarti and A. Laugier, *3D Distribution Study of Impurities into a Polix Ingot*, Proceedings of the 13$^{th}$ European Photovoltaic Solar Energy Conference, pp. 1340–1343 (Oct. 23–27, 1995).

Derwent Abstract and Patent Abstracts of Japan for Japanese Patent, Publication No. JP 05–17292–A (Japan, Jan. 26, 1993).

Derwent Abstract and Patent Abstracts of Japan for Japenese Patent, Publication No. JP 07–41390–A (Japan, Feb. 10, 1995.

*Primary Examiner*—Matthew Smith
*Assistant Examiner*—Granvill D. Lee, Jr.
*Attorney, Agent, or Firm*—Connolly Bove Lodge & Hutz LLP

[57] ABSTRACT

The present invention relates to a process for the production of polycrystalline silicon mouldings substantially free of low lifetime edge regions and the use of these mouldings.

13 Claims, 3 Drawing Sheets

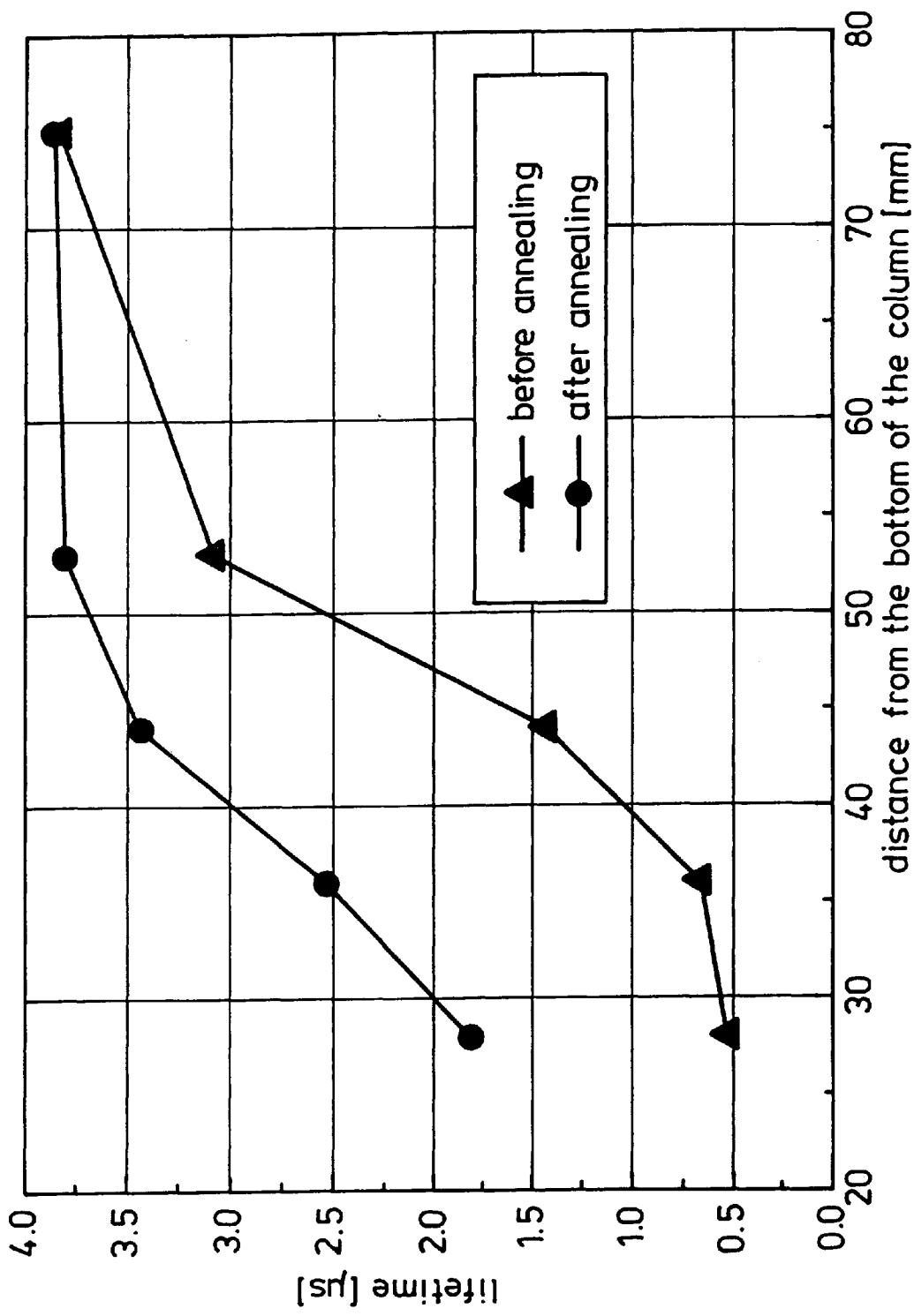

PROCESS FOR THE PRODUCTION OF POLYCRYSTALLINE SILICON MOULDINGS SUBSTANTIALLY FREE OF EDGE REGIONS AND THE USE OF THESE MOULDINGS

The present invention relates to a process for the production of polycrystalline silicon molding substantially free of edge regions and the use of these moldings.

Polycrystalline silicon is the starting material for solar cells. Economic production processes are therefore of great importance. In the course of the production, the solidification of polycrystalline silicon for solar cells from the melt is carried out in a crucible which consists mostly of $Si_3N_4$, graphite or quartz and internally almost always possesses an additional $Si_3N_4$ coating. High material qualities for applications in photovoltaics are achieved by establishing a planar solid-liquid interface (columnar solidification).

The material quality of the polycrystalline silicon is investigated by a measurement of the so-called charge-carrier lifetime (effective lifetime). The effective lifetime of optically generated charge carriers in the silicon is associated with the achievable efficiency of solar cells. The charge-carrier lifetime can be determined, for example, from the time required for the reflected microwave signal to decay following a pulse of laser light. In all polycrystalline materials available on the market, the lifetime is decreased in the vicinity of the wall of the ingot crucible (<1 $\mu$s; the values in the interior of the block are in the range of 4 to 5 $\mu$s; see, for example, Proceedings of the 13th European Photovoltaic Solar Energy Conference, Nice, 1336–1339, 1340–1343 and 1415–1417 (1995)), which results in unsatisfactory properties of the material close to the crucible walls. The width of the edge region having a relatively short lifetime is 4 to 5 cm at the bottom (the total block height is in the range of 20 to 25 cm) and decreases laterally from 4 to 5 cm at the bottom to approximately 1 cm at the top. Thus, in relation to the block height, reduced effective lifetime values of less than 25% of the values attained in the interior of the block are found in about 20% of the silicon block. To comply with lifetime specifications, in most cases several cm of the block material have therefore to be cut off and cannot be used for the production of wafers for the manufacture of solar cells.

The width of the edge regions depends upon the temperature conditions and time schedule of the block crystallization and cooling. The width of the edge zones increases with increasing time and rising temperature. To date it has only been possible to influence the width of the edge zones to a very small extent by means of variations of the actual production process.

Suitable processes for minimizing the width of the edge regions are however unknown to date.

The object of this invention was therefore the provision of a process which renders possible the production of polycrystalline silicon molding substantially free of edge regions having a short lifetime without any loss of silicon.

It has now been found that it is possible to produce molding substantially free of edge regions from polycrystalline silicon molding having edge regions by subjecting the latter to an annealing process at temperatures of greater than 450° C., the cooling rate to temperatures of less than 300° C. being at least 5 C/min.

This invention therefore provides a process for the production of molding substantially free of edge regions, characterized in that silicon molding having edge regions are subjected to annealing at temperatures greater than 450° C., preferably greater than 500° C., and are cooled to below 300° C. at rates of more than 5 K/min, preferably 10 to 20 C/min.

The annealing is carried out preferably at temperatures of between 500° C. and 1000° C., preferably between 600° C. and 800° C.

The polycrystalline silicon having edge regions can be heated in any manner, such as, for example, in tube furnaces with resistance heating. To achieve an increase in the charge-carrier lifetime in the edge regions longer times are preferred at lower temperatures (at 500° C., approximately 2 hours), whereas shorter times are preferred at higher temperatures. Annealing steps carried out at about 700° C. for 30 minutes are preferred.

The improvement in lifetime obtained is independent of the gas atmosphere employed during annealing, but nitrogen or argon are preferably used. The cooling step to temperatures close to room temperature is preferably carried out rapidly within less than one hour. This cooling is thus in particular more rapid than that of the previous cooling of the polycrystalline silicon block after solidification in the crystallization units.

In this process the mouldings may already be in cut form.

The polycrystalline silicon containing edge regions is produced preferably by the ingot-casting or Bridgman process.

The lifetime values in the edge regions of the polycrystalline silicon block are improved by the process according to the invention. The effective lifetimes obtained are in the range of 1 to 5 $\mu$s.

The polycrystalline silicon blocks obtainable by the process according to the invention are distinguished primarily by already having an effective charge-carrier lifetime of at least 50% of the values obtained in the center of the block, at a distance from the lateral and lower block edge that corresponds to at most 10% of the total block height.

The invention also provides the use of the polycrystalline silicon mouldings free of edge regions and produced by the process according to the invention as wafers, preferably for the manufacture of solar cells.

The process according to the invention is explained by means of the following Examples.

The invention is not however limited to the Examples.

EXAMPLES

The silicon used in both of the following Examples is commercially available polycrystalline silicon which was produced by the Bridgman process.

Example 1

Silicon wafers cut from the bottom region (edge zone) of a silicon column (total height approx. 200 mm) were annealed at 620° C. for 30 minutes in a resistance-heated tube furnace and then cooled to below 300° C. at a rate of approx. 20 C/min. The temperature treatment was carried out in a quartz glass tube under a nitrogen atmosphere.

FIG. 1 shows the average effective lifetime values of the wafers before and after annealing. The effective lifetime means that the lifetime measurement was carried out without passivation of the wafer surfaces.

Prior to annealing, in the case of distances from the bottom of the column of less than 40 mm, the lifetime fell to values of below 1 $\mu$s (edge effect). Typical lifetime values in the edge region (0.5 $\mu$s) were about eight times lower than the values obtained in the center of the column. After the heating and rapid cooling of the wafers, the reduction in the lifetime at the bottom (edge region) of the column was not very marked. Over virtually the entire height of the column the lifetimes obtained were in the range of 2 to 4 $\mu$s; these values are also typical for the center of the column.

Example 2

The column investigated was subjected, solely by the process according to the invention, to a temperature treatment for a period of 40 minutes at a temperature of 750° C. in a muffle furnace under an atmosphere of air. The cooling time to temperatures below 300° C. was about 40 minutes (corresponding to a cooling gradient of approx. 10 C/min).

Figure 2A:
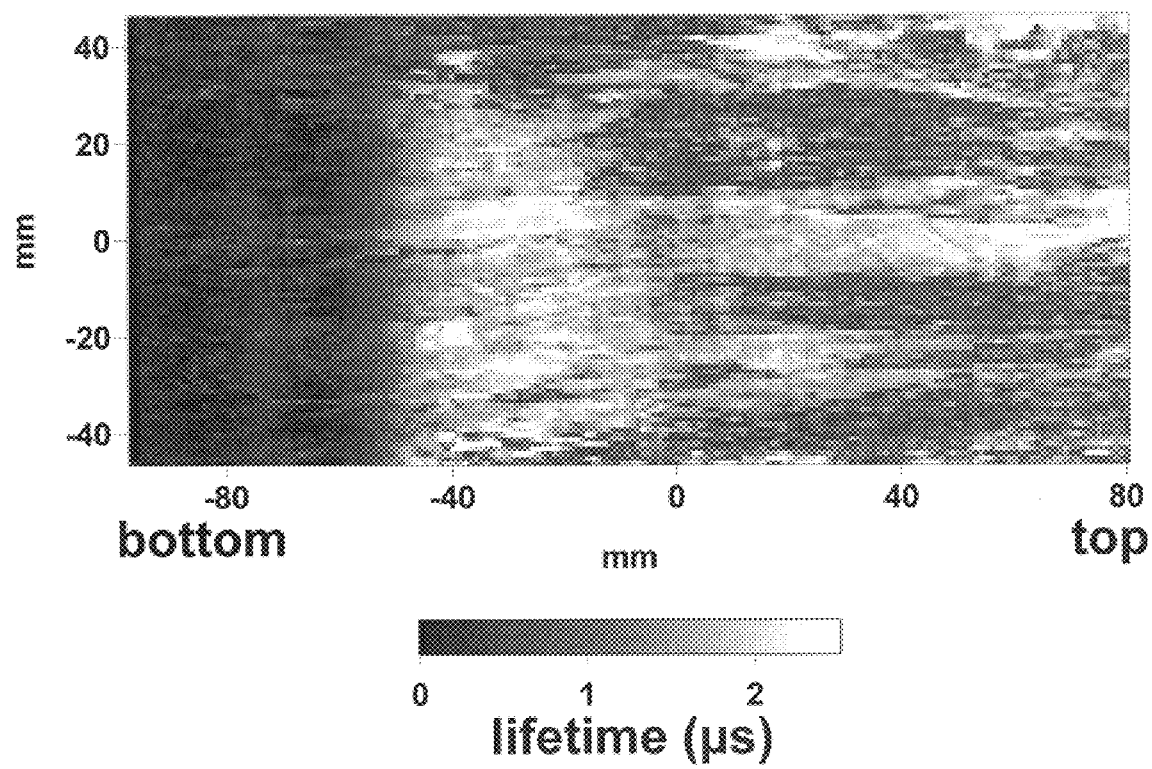
FIG. 2a shows the measured results for the column which has not been after-treated, which corresponds to the condition after crystallization and slow cooling of the polycrystalline silicon block. In the bottom region of the column, an edge region (width approx. 40 mm) having lifetime values in the range of less than 1 μs is clearly visible.
Figure 2B:
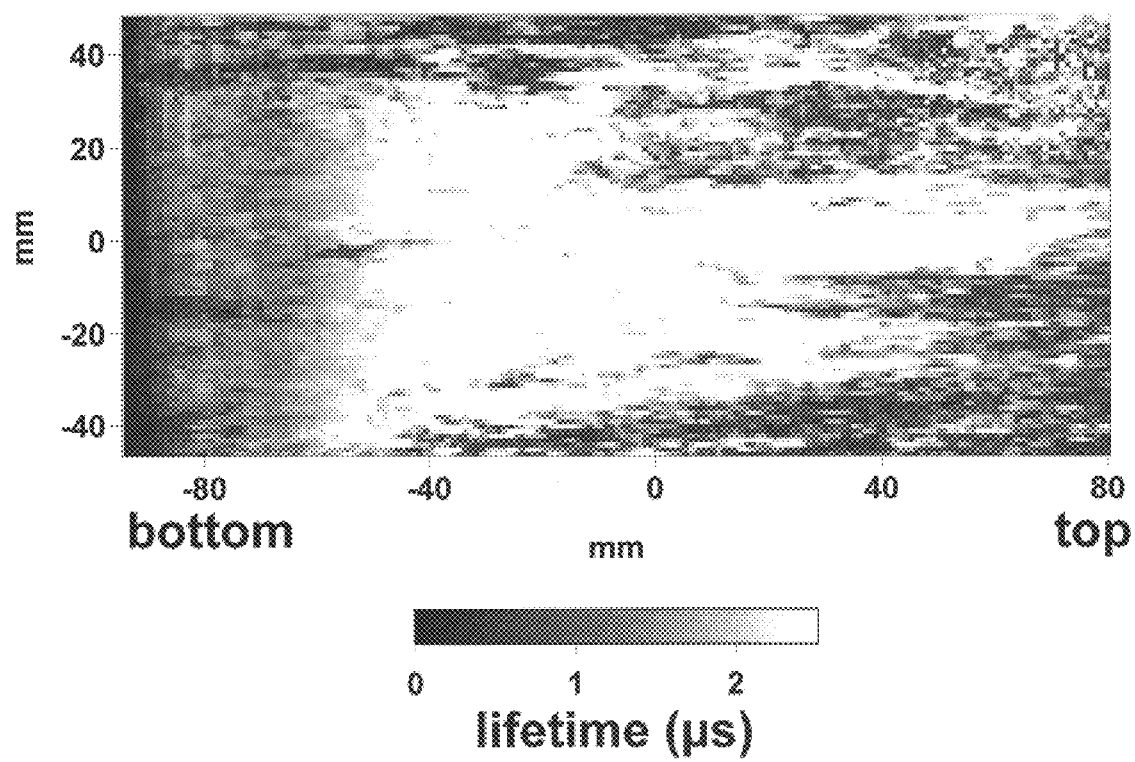
FIG. 2 shows measurements of effective lifetimes of a polycrystalline silicon column (total height approx. 200 cm, width approx. 100 mm). Before the measurements were taken, in each case the surfaces of the column were etched using an alkaline etching agent (surface removal of a few μm) in order to remove any surface layers present which might distort the measurement of the lifetime value.

The subsequently annealed column was virtually free of edge regions. The width of the low lifetime edge was only a few mm (see FIG. 2b). Lifetime values of more than 1.5 μs were obtained over almost the entire height of the column.

What is claimed is:

1. A process for producing polycrystalline silicon moldings substantially free of edge regions, the process comprising the steps of:
   a) annealing silicon mouldings having edge regions at a temperature of greater than about 450° C.; and
   b) cooling the annealed silicon mouldings to a temperature of less than about 300° C. at a cooling rate greater than about 5° C./min.

2. The process according to claim 1, wherein the annealing step a) is carried out at a temperature of between about 500° C. and 1000° C.

3. A process according to claim 2, wherein the annealing step a) is carried out at a temperature of between about 600° C. and 800° C.

4. The process according to claim 3, wherein the annealing step a) is carried out at a temperature of about 700° C. for about 30 minutes.

5. The process according to claim 1, wherein the cooling rate of the cooling step b) is about 10 to 20° C./min.

6. A process according to claim 1, wherein the annealing step a) is carried out for up to about 2 hours.

7. The process according to claim 6, wherein the annealing step a) is carried out at a temperature of about 500° C.

8. The process according to claim 1, wherein the annealing step a) is carried out in a gas atmosphere.

9. The process according to claim 8, wherein the gas atmosphere is nitrogen or argon.

10. The process according to claim 1, wherein the cooling step b) is carried out in less than 1 hour.

11. A polycrystalline silicon molding or block produced by the process according to claim 1.

12. A wafer compromising the polycrystalline silicon molding according to claim 11.

13. A solar cell comprising the wafer according to claim 12.

* * * * *